US011942382B2

(12) United States Patent
Nomura (10) Patent No.: US 11,942,382 B2
(45) Date of Patent: Mar. 26, 2024

(54) SEMICONDUCTOR DEVICE AND METHOD FOR MANUFACTURING SEMICONDUCTOR ELEMENT (71) Applicant: Mitsubishi Electric Corporation, Tokyo (JP)

(72) Inventor: Noritsugu Nomura, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 377 days.

(21) Appl. No.: 16/874,488

(22) Filed: May 14, 2020

(65) Prior Publication Data
US 2021/0098317 A1 Apr. 1, 2021

(30) Foreign Application Priority Data

Sep. 26, 2019 (JP) ................................ 2019-175083

(51) Int. Cl.
*H01L 21/66* (2006.01)
*H01L 21/02* (2006.01)
*H01L 21/78* (2006.01)

(52) U.S. Cl.
CPC ........ *H01L 22/30* (2013.01); *H01L 21/02118* (2013.01); *H01L 21/02282* (2013.01); *H01L 21/78* (2013.01); *H01L 22/14* (2013.01)

(58) Field of Classification Search
CPC ... H01L 21/78; H01L 22/30; H01L 21/02118; H01L 21/02282
See application file for complete search history.

(56) References Cited

U.S. PATENT DOCUMENTS 5,880,528 A * 3/1999 Seshan .................. H01L 23/585
257/776
10,163,858 B1 * 12/2018 Liu ..................... H01L 23/5226
(Continued)

FOREIGN PATENT DOCUMENTS

CN 102741992 A 10/2012
CN 104597384 A 5/2015
(Continued)

OTHER PUBLICATIONS

"Notice of Reasons for Refusal" Office Action issued in JP 2019-175083; mailed by the Japanese Patent Office dated Aug. 2, 2022.
(Continued)

*Primary Examiner* — Mohammad M Choudhry
(74) *Attorney, Agent, or Firm* — Studebaker & Brackett PC (57) ABSTRACT When a voltage is applied to a semiconductor element formed into a semiconductor substrate for evaluating the electrical characteristic of the semiconductor element, partial discharge between the semiconductor element and an inter-element portion, adhesion of a foreign substance to the semiconductor substrate, and formation of a trace of a component in the semiconductor substrate are prevented. A semiconductor device includes a semiconductor substrate and a discharge inhibitor. The semiconductor substrate includes a plurality of semiconductor elements and an inter-element portion. The semiconductor elements are arranged in a spreading direction of the semiconductor substrate. The inter-element portion is between adjacent semiconductor elements among the semiconductor elements. The discharge inhibitor is bonded not to a surface of a center of each semiconductor element among the semiconductor elements but to a surface of the inter-element portion. The discharge inhibitor is made of an insulator.

10 Claims, 11 Drawing Sheets

(56) References Cited

U.S. PATENT DOCUMENTS

| | | | |
|---|---|---|---|
| 2007/0087524 A1* | 4/2007 | Montgomery | H01L 21/78 438/428 |
| 2007/0117338 A1* | 5/2007 | Yamamoto | H01L 23/49822 438/396 |
| 2011/0073974 A1* | 3/2011 | Takano | H01L 27/14618 257/432 |
| 2014/0342544 A1 | 11/2014 | Akiyama et al. | |
| 2015/0115989 A1* | 4/2015 | Okada | G01R 1/18 324/754.03 |
| 2016/0027662 A1 | 1/2016 | Soeno et al. | |

FOREIGN PATENT DOCUMENTS

| | | |
|---|---|---|
| JP | 2001-051011 A | 2/2001 |
| JP | 2010-010306 A | 1/2010 |
| JP | 2014-229651 A | 12/2014 |
| JP | 2016-025250 A | 2/2016 |
| JP | 2017-063223 A | 3/2017 |

OTHER PUBLICATIONS

An Office Action mailed by the Chinese Patent Office dated Nov. 1, 2023, which corresponds to Chinese Patent Application No. 202010994209X and is related to U.S. Appl. No. 16/874,488.

* cited by examiner

SEMICONDUCTOR DEVICE AND METHOD FOR MANUFACTURING SEMICONDUCTOR ELEMENT

BACKGROUND OF THE INVENTION

Field of the Invention

The present invention relates to a semiconductor device and a method for manufacturing a semiconductor element.

Description of the Background Art

Chip-like semiconductor elements are manufactured by forming a plurality of semiconductor elements into a semiconductor substrate and separating the formed semiconductor elements.

When electrical characteristics of the chip-like semiconductor elements are evaluated upon being manufactured, the electrical characteristics of the separated semiconductor elements or the semiconductor elements that are formed into the semiconductor substrate but are not separated may be evaluated.

When the electrical characteristics of the separated semiconductor elements are evaluated, a surface-for-placing of a semiconductor element to be evaluated is placed to come in contact with a surface of a chuck stage of an evaluation apparatus and fixed on the surface by, for example, vacuum suction. Then, a probe of the evaluation apparatus is brought in contact with a surface-not-for-placing of the semiconductor element to be evaluated so that electrical signals are transmitted and received to and from the semiconductor element to be evaluated. When the semiconductor element to be evaluated has a vertical structure in which a large current flows in the vertical direction, namely, in an off-plane direction, the chuck stage functions as an electrode.

When the electrical characteristics of the separated semiconductor elements are evaluated and the semiconductor elements to be evaluated have the vertical structure, partial discharge may occur in the semiconductor elements to be evaluated. Partial discharge occurs due to, for example, a potential difference between a potential of an electrode disposed in a part of the surface-not-for-placing of the semiconductor element and a potential of a region having the same potential as that of the chuck stage. Furthermore, partial discharge causes a semiconductor element to malfunction, such as partial breakage in the semiconductor element. If partial discharge is overlooked in a step of evaluating the electrical characteristics of the semiconductor elements and a semiconductor element that malfunctions is sent to downstream operations as a conforming item as it is, it is difficult to screen out such a semiconductor element in the downstream operations. Thus, studies have been made on installing, in the evaluation apparatus, an element for inhibiting partial discharge and a malfunction in the semiconductor elements.

For example, according to the technology described in Japanese Patent Application Laid-Open No. 2001-51011 (hereinafter referred to as Patent Document 1), an evaluation jig is used for evaluating high voltage semiconductor chips. The evaluation jig includes a probe holder. The probe holder includes a fitted portion. A silicone rubber is fitted into the fitted portion. The silicone rubber is pressed against terminal portions of a high voltage semiconductor chip. Thereby, the silicone rubber can interrupt a spark path from a side portion to an emitter electrode or a gate electrode of the high voltage semiconductor chip (paragraphs 0030 to 0045).

When the electrical characteristics of the semiconductor elements that are formed into semiconductor substrates but are not separated are evaluated, a probe of the evaluation apparatus is brought in contact with an electrode on the surface-not-for-placing of the semiconductor element to be evaluated so that electrical signals are transmitted and received to and from the semiconductor element to be evaluated.

When the electrical characteristics of the semiconductor elements that are formed into semiconductor substrates but are not separated are evaluated, partial discharge may also occur in the semiconductor elements to be evaluated. Partial discharge also causes a semiconductor element to malfunction, such as partial breakage in the semiconductor element. If partial discharge is overlooked in a step of evaluating the electrical characteristics of the semiconductor elements and a semiconductor element that malfunctions is sent to downstream operations as a conforming item as it is, it is difficult to screen out such a semiconductor element in the downstream operations. Thus, studies have been made on installing, in the evaluation apparatus, an element for inhibiting partial discharge and a malfunction in the semiconductor elements.

For example, according to the technology described in Japanese Patent Application Laid-Open No. 2010-10306 (hereinafter referred to as Patent Document 2), a semiconductor wafer measurement apparatus conducts tests on a semiconductor device formed on a wafer. In the semiconductor wafer measurement apparatus, an insulating component is disposed between a pair of probe tips that is in contact with a wafer so that the insulating component is brought in contact with the wafer. This can effectively prevent interface discharge on the wafer. Thus, dielectric breakdown caused by discharge between probes can be avoided (paragraphs 0023 to 0026).

According to the technology described in Patent Document 1, the silicone rubber is pressed against the high voltage semiconductor chip. Thus, a foreign substance sandwiched between the silicone rubber and the high voltage semiconductor chip adheres to the high voltage semiconductor chip. Moreover, traces of the silicone rubber are formed in the high voltage semiconductor chip. The adhering foreign substance and the formed traces of the silicone rubber cause the high voltage semiconductor chip to malfunction in downstream operations.

Furthermore, the silicone rubber is repeatedly pressed against a plurality of high voltage semiconductor chips according to the technology described in Patent Document 1. Thus, when a foreign substance is sandwiched between the silicone rubber and a high voltage semiconductor chip, the sandwiched foreign substance then adheres to a plurality of high voltage semiconductor chips against which the silicone rubber is pressed afterwards, and contamination caused by the foreign substance spreads over the plurality of high voltage semiconductor chips. Thus, when a foreign substance is sandwiched between the silicone rubber and a high voltage semiconductor chip, a plurality of high voltage semiconductor chips that are to be subsequently sent to downstream operations malfunction. Thereby, the foreign substance that adheres to the silicone rubber needs to be managed. However, such management is complicated and difficult.

According to the technology described in Patent Document 2, an insulating component is brought in contact with a wafer. Thus, a foreign substance sandwiched between the insulating component and the wafer adheres to the wafer similarly to the technology described in Patent Document 1.

Moreover, traces of the insulating component are formed in the wafer. The adhering foreign substance and the formed traces of the insulating component cause wafers and high voltage semiconductor elements to malfunction in downstream operations.

Furthermore, the insulating component is repeatedly brought in contact with a plurality of wafers according to the technology described in Patent Document 2. Thus, when a foreign substance is sandwiched between the insulating component and a wafer, the sandwiched foreign substance adheres to a plurality of wafers in contact with which the insulating component is to be brought, and contamination caused by the foreign substance spreads over the plurality of wafers. Thus, when a foreign substance is sandwiched between the insulating component and a wafer, a plurality of wafers and a plurality of high voltage semiconductor elements that are to be sent to downstream operations malfunction. Thereby, the foreign substance that adheres to the insulating component needs to be managed. However, such management is complicated and difficult.

In addition, the technology described in Patent Document 2 cannot inhibit partial discharge occurring between a high voltage semiconductor element formed on the wafer and an inter-element portion between adjacent high voltage semiconductor elements formed on the wafer, which poses an actual problem.

In recent years, high power testing has been possible for evaluating the electrical characteristics of semiconductor elements formed into semiconductor substrates. The efficiency of product assembly has also been increased by directly assembling semiconductor substrates into products. Thus, in many cases, the electrical characteristics of the separated semiconductor elements are not evaluated, but the electrical characteristics of the semiconductor elements that are formed into semiconductor substrates but are not separated are evaluated. However, evaluation of the electrical characteristics of the semiconductor elements that are formed into semiconductor substrates but are not separated causes the aforementioned problems.

SUMMARY

An object of the present disclosure is to provide a semiconductor device and a method for manufacturing a semiconductor element which can prevent, when a voltage is applied to the semiconductor element formed into a semiconductor substrate for, for example, evaluating the electrical characteristic of the semiconductor element, partial discharge between the semiconductor element and an inter-element portion, adhesion of a foreign substance to the semiconductor substrate, and formation of a trace of a component in the semiconductor substrate.

The first disclosure relates to a semiconductor device.

The semiconductor device includes a semiconductor substrate and a discharge inhibitor.

The semiconductor substrate includes a plurality of semiconductor elements and an inter-element portion. The plurality of semiconductor elements are arranged in a spreading direction of the semiconductor substrate. The inter-element portion is between adjacent semiconductor elements among the plurality of semiconductor elements.

The discharge inhibitor is bonded not to a surface of a center of each semiconductor element among the plurality of semiconductor elements but to a surface of the inter-element portion. The discharge inhibitor is made of an insulator.

The second disclosure relates to a method for manufacturing a semiconductor element.

In the method for manufacturing a semiconductor element, a semiconductor substrate is prepared. The semiconductor substrate to be prepared includes a plurality of semiconductor elements and a dicing line. The plurality of semiconductor elements are arranged in a spreading direction of the semiconductor substrate. The dicing line is between adjacent semiconductor elements among the plurality of semiconductor elements.

The discharge inhibitor is bonded to the semiconductor substrate. The discharge inhibitor is bonded not to a surface of a center of each semiconductor element among the plurality of semiconductor elements but to a surface of the dicing line. The discharge inhibitor is made of an insulator.

A voltage is applied to each semiconductor element after the discharge inhibitor is bonded to the semiconductor substrate.

The discharge inhibitor is peeled off from the semiconductor substrate after the voltage is applied to each semiconductor element.

The semiconductor substrate is diced along the dicing line after the discharge inhibitor is peeled off from the semiconductor substrate.

According to the first disclosure, the surface of the inter-element portion, which is a portion where partial discharge starts, is covered with the discharge inhibitor made of the insulator. This can lengthen the creepage distance between each semiconductor element and the inter-element portion, and inhibit partial discharge between each semiconductor element and the inter-element portion when a voltage is applied to each semiconductor element for, for example, evaluating the electrical characteristic of the semiconductor element.

According to the second disclosure, even when a component for inhibiting partial discharge is not pressed against the semiconductor substrate, the discharge inhibitor can secure the creepage distance between each semiconductor element and the inter-element portion. Thus, the component for inhibiting partial discharge need not be pressed against the semiconductor substrate. This can prevent, for example, adhesion of a foreign substance to the semiconductor substrate and formation of the trace of the component in the semiconductor substrate.

These and other objects, features, aspects and advantages of the present invention will become more apparent from the following detailed description of the present invention when taken in conjunction with the accompanying drawings.

DESCRIPTION OF THE PREFERRED EMBODIMENTS

Embodiment 1

1.1 Planar Structure of Semiconductor Substrate

Figure 1:
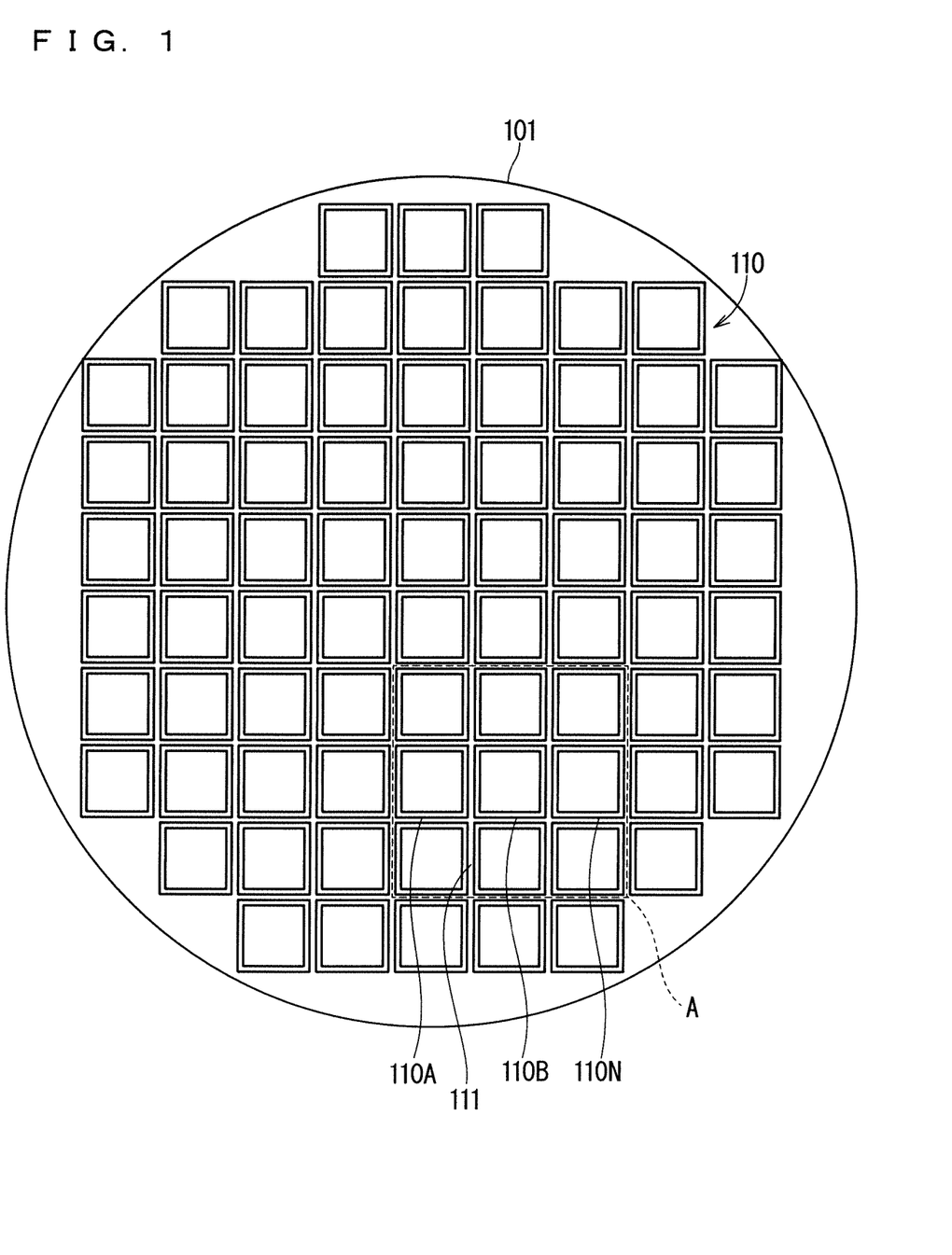
FIG. 1 schematically illustrates a top view of a semiconductor substrate included in a semiconductor device according to Embodiment 1.
Figure 2:
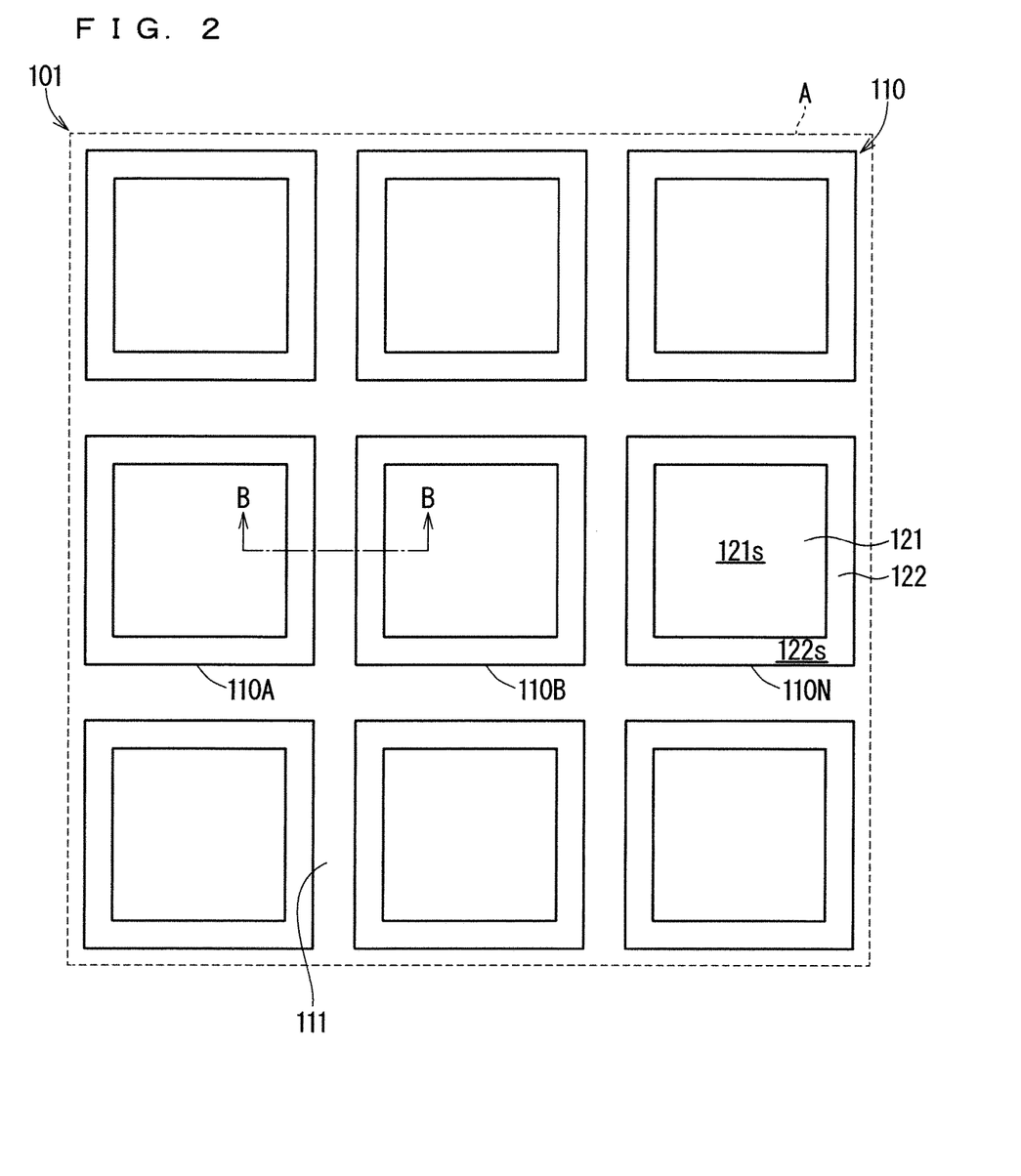
FIG. 2 schematically illustrates an enlarged top view of a part of the semiconductor substrate included in the semiconductor device according to Embodiment 1.

FIG. 1 schematically illustrates a top view of a semiconductor substrate included in a semiconductor device according to Embodiment 1. FIG. 2 schematically illustrates an enlarged top view of a part of the semiconductor substrate included in the semiconductor device according to Embodiment 1. Specifically, FIG. 2 illustrates an enlarged view of a portion A illustrated in FIG. 1.

A semiconductor substrate 101 illustrated in FIGS. 1 and 2 includes a plurality of semiconductor elements 110 and inter-element portions 111.

The plurality of semiconductor elements 110 are arranged in a spreading direction of the semiconductor substrate 101. The plurality of semiconductor elements 110 are arranged in a matrix on the semiconductor substrate 101 illustrated in FIGS. 1 and 2. The plurality of semiconductor elements 110 are fabricated by forming, for example, a p-type diffusion layer and an n-type diffusion layer on a semiconductor wafer and disposing, for example, electrodes and insulating layers above the semiconductor wafer.

The inter-element portion 111 is between adjacent semiconductor elements 110A and 110B included in the plurality of semiconductor elements 110.

The chip-like semiconductor elements are manufactured from the semiconductor substrate 101. In order to do so, the semiconductor substrate 101 is diced along the inter-element portions 111, so that the plurality of semiconductor elements 110 are separated from one another. Thus, the inter-element portions 111 are dicing lines along which the semiconductor substrate 101 is diced.

As illustrated in FIG. 2, each semiconductor element 110N included in the plurality of semiconductor elements 110 includes an active area 121 and a terminal area 122. The terminal area 122 surrounds the active area 121. When each semiconductor element 110N is energized, a main current flows through the active area 121. The terminal area 122 is a field grading region in which a field grading structure is formed. The field grading structure grades the electric field concentration on a surface 122S of the terminal area 122, and increases the breakdown voltage of each semiconductor element 110N.

1.2 Cross-Sectional Structure of Semiconductor Substrate

Figure 3:
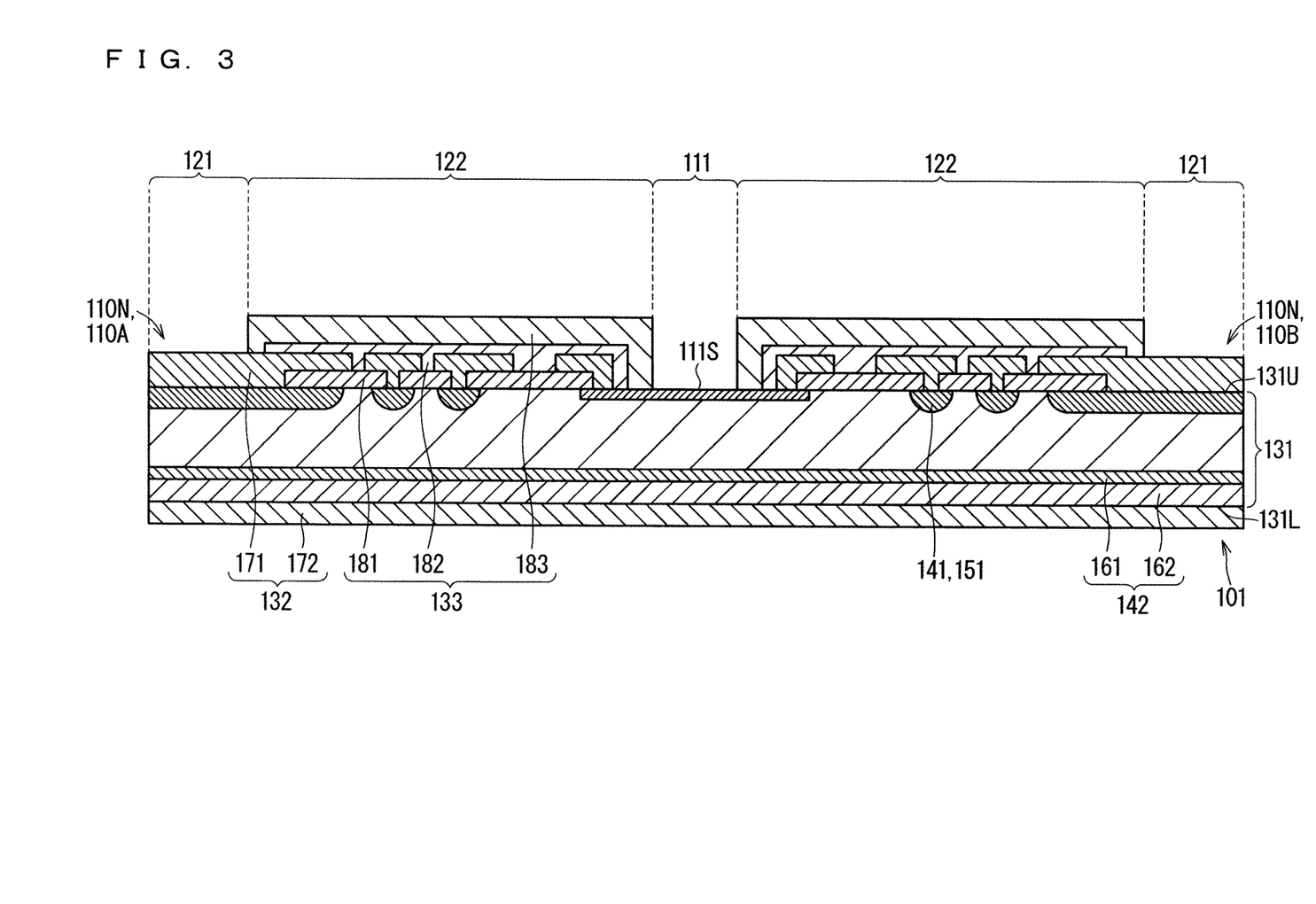
FIG. 3 schematically illustrates a sectional view of the semiconductor substrate included in the semiconductor device according to Embodiment 1.

FIG. 3 schematically illustrates a sectional view of the semiconductor substrate included in the semiconductor device according to Embodiment 1. FIG. 3 illustrates a section corresponding to a cutting plane line B-B in FIG. 2. FIG. 3 illustrates adjacent semiconductor elements and an inter-element portion disposed therebetween.

As illustrated in FIG. 3, the semiconductor substrate 101 includes a semiconductor wafer 131, electrodes 132, and insulating layers 133. The electrodes 132 and the insulating layers 133 are disposed on the semiconductor wafer 131. The semiconductor wafer 131 includes a p-type diffusion layer 141 and an n-type diffusion layer 142. These form each semiconductor element 110N on the semiconductor substrate 101.

Each semiconductor element 110N is a diode on the semiconductor substrate 101 illustrated in FIG. 3. Each semiconductor element 110N may be a semiconductor element other than the diode. Each semiconductor element 110N may be, for example, a metal-oxide-semiconductor field-effect transistor (MOSFET) or an insulated gate bipolar transistor (IGBT).

The p-type diffusion layer 141 includes a p-type region 151. The p-type region 151 is formed along an upper surface 131U of the semiconductor wafer 131. The p-type region 151 is formed over the entire surface of the active areas 121, whereas the p-type region 151 is discretely formed in the terminal areas 122.

The n-type diffusion layer 142 includes an n-type grading region 161 and an n-type region 162. The n-type grading region 161 and the n-type region 162 are formed along a lower surface 131L of the semiconductor wafer 131. The n-type grading region 161 and the n-type region 162 are formed over the entire surface of the semiconductor wafer 131.

The electrodes 132 include a top electrode 171 and a bottom electrode 172. The top electrode 171 is disposed on the upper surface 131U of the semiconductor wafer 131. The top electrode 171 is formed over the entire surface of the active areas 121, whereas the top electrode 171 is discretely formed in the terminal areas 122. The top electrode 171 is in contact with the p-type region 151, and functions as an anode. The bottom electrode 172 is disposed on the lower surface 131L of the semiconductor wafer 131. The bottom electrode 172 is disposed over the entire surface of the semiconductor wafer 131. The bottom electrode 172 is in contact with the n-type region 162, and functions as a cathode.

The insulating layers 133 include a first insulating layer 181, a second insulating layer 182, and a third insulating layer 183. The first insulating layer 181, the second insulating layer 182, and the third insulating layer 183 are disposed on the upper surface 131U of the semiconductor wafer 131. The first insulating layer 181, the second insulating layer 182, and the third insulating layer 183 are disposed in the terminal areas 122. The first insulating layer 181 is directly disposed on the upper surface 131U of the semiconductor wafer 131. The second insulating layer 182, which is overlaid on the top electrode 171 and the first insulating layer 181, is disposed on the upper surface 131U of the semiconductor wafer 131. The third insulating layer 183, which is overlaid on the top electrode 171, the first insulating layer 181, and the second insulating layer 182, is disposed on the upper surface 131U of the semiconductor wafer 131. The second insulating layer 182 is made of an insulating material containing nitrogen. The third insulating layer 183 is made of an organic insulating material.

A surface 111S of the inter-element portion 111 is exposed. Thus, application of a voltage to each semiconductor element 110N for, for example, evaluation thereof may cause partial discharge between the top electrode 171 belonging to each semiconductor element 110N and the inter-element portion 111. For example, application of a specific potential such as a potential of 600 V or more to the top electrode 171 belonging to each semiconductor element 110N causes partial discharge between the top electrode 171 and the inter-element portion 111.

1.3 Bonding of Discharge Inhibitor

Figure 4:
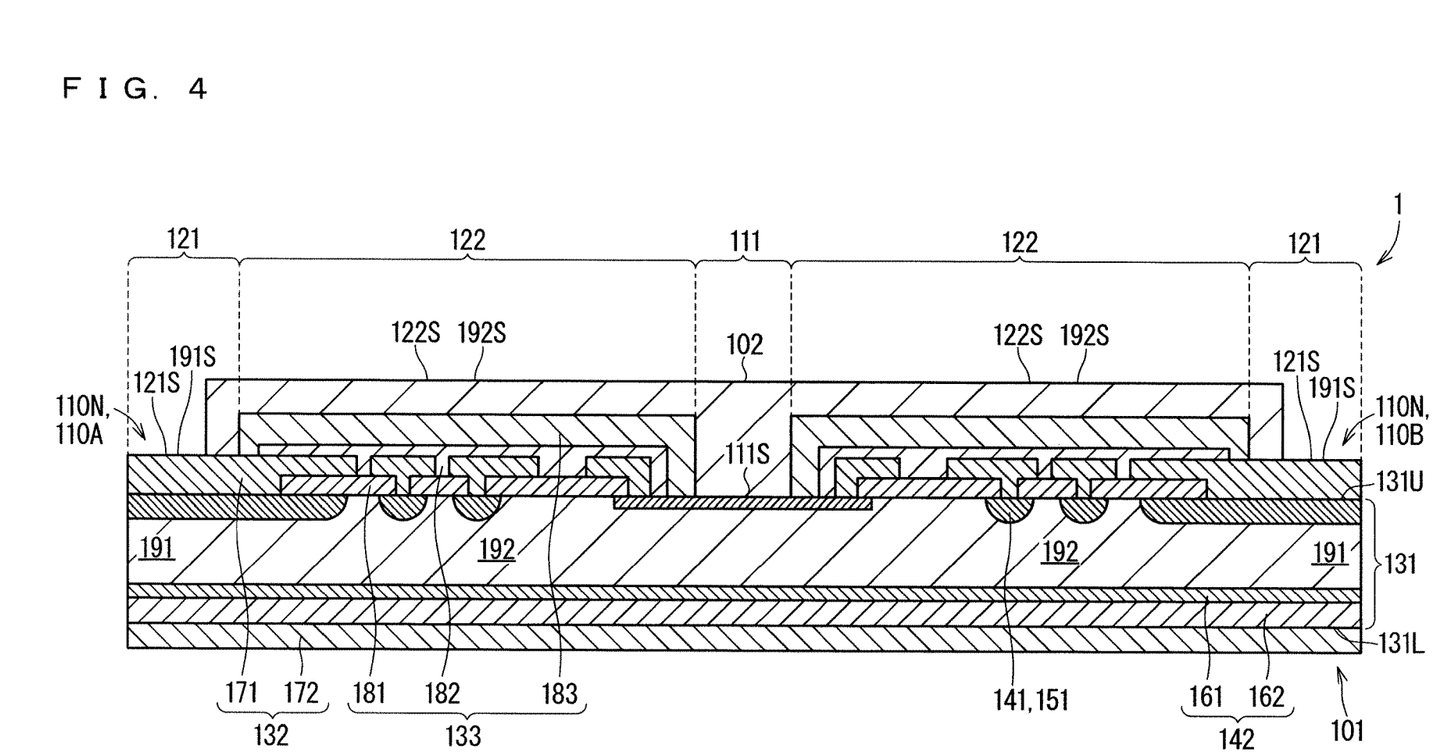
FIG. 4 schematically illustrates a sectional view of the semiconductor device according to Embodiment 1.
Figure 5:
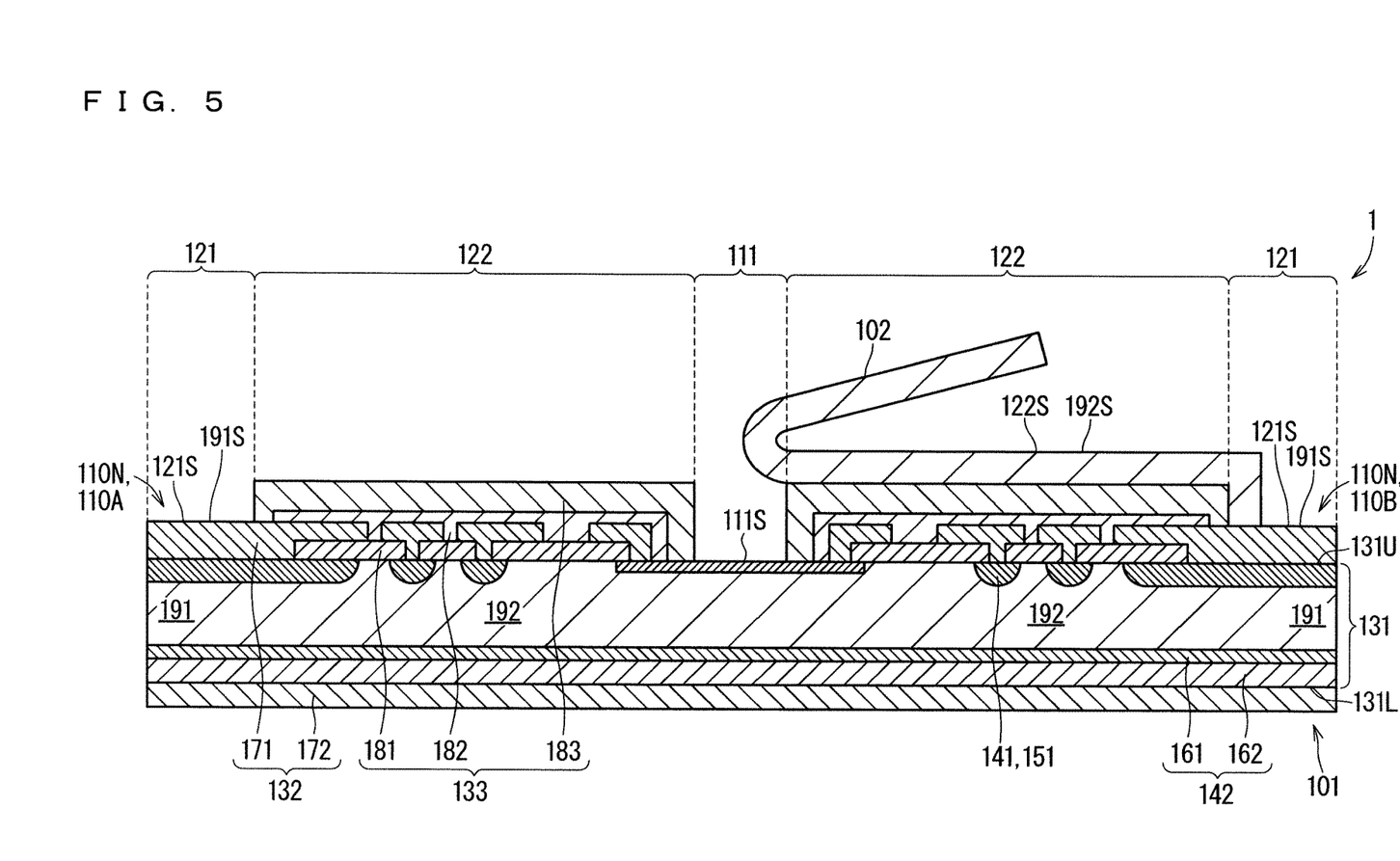
FIG. 5 schematically illustrates a sectional view of the semiconductor device according to Embodiment 1 when a discharge inhibitor is peeled off from the semiconductor substrate.

FIG. 4 schematically illustrates a sectional view of the semiconductor device according to Embodiment 1. FIG. 5 schematically illustrates a sectional view of the semiconductor device according to Embodiment 1 when a discharge inhibitor is peeled off from the semiconductor substrate. FIGS. 4 and 5 illustrate a section corresponding to the cutting plane line B-B in FIG. 2.

A semiconductor device 1 according to Embodiment 1 illustrated in FIGS. 4 and 5 includes the semiconductor substrate 101 and a discharge inhibitor 102.

The discharge inhibitor 102 is bonded to the surface 111S of the inter-element portion 111 to cover the surface 111S. The discharge inhibitor 102 is made of an insulator. Thus, the surface 111S of the inter-element portion 111, which is a portion where partial discharge starts, is covered with the discharge inhibitor 102 made of the insulator. This can secure a creepage distance between each semiconductor element 110N and the inter-element portion 111, and inhibit partial discharge between each semiconductor element 110N and the inter-element portion 111 which occurs when a voltage is applied to each semiconductor element 110N for, for example, evaluation thereof.

The discharge inhibitor 102 is not bonded to a surface 191S of a center 191 of each semiconductor element 110N. This can prevent the high heat emitted from the surface 191S of the center 191 of each semiconductor element 110N from being transferred to the discharge inhibitor 102. Consequently, the discharge inhibitor 102 can be prevented from, for example, degradation or shrinkage caused by the heat.

The discharge inhibitor 102 is bonded to a surface 192S of a perimeter 192 of each semiconductor element 110N to cover the surface 192S. Specifically, the discharge inhibitor 102 is bonded to a part of a surface 121S of the active area 121 and a surface 122S of the terminal area 122 to cover the part of the surface 121S of the active area 121 and the surface 122S of the terminal area 122. This can further lengthen the creepage distance between each semiconductor element 110N and the inter-element portion 111, and further inhibit partial discharge between each semiconductor element 110N and the inter-element portion 111.

For example, the discharge inhibitor 102 is made of a latex, or is a dry film or a rubber seal.

When the discharge inhibitor 102 is made of a latex, the discharge inhibitor 102 can be formed by forming a coating film with application of a latex fluid to be cured to the semiconductor substrate 101 and then curing the formed coating film.

For example, a coating applicator such as an ink-jet device sprays the fluid to be cured on the semiconductor substrate 101 to apply the fluid to the semiconductor substrate 101. When an ink-jet device sprays the fluid to be cured on the semiconductor substrate 101 to apply the fluid to the semiconductor substrate 101, a patterning mask is unnecessary. Consequently, a step of forming the discharge inhibitor 102 can be simplified. Moreover, the discharge inhibitor 102 can be peeled off from the semiconductor substrate 101 without damaging the plurality of semiconductor elements 110 as illustrated in FIG. 5.

After a voltage is applied to each semiconductor element 110N for its evaluation, the discharge inhibitor 102 is peeled off from the semiconductor substrate 101. Consequently, adhesion of a foreign substance such as dust to a surface covered with the discharge inhibitor 102 can be prevented during the storage of the semiconductor device 1.

The discharge inhibitor 102 includes an opening having an area large enough to evaluate each semiconductor element 110N and for exposing the top electrode 171 belonging to each semiconductor element 110N. This enables each semiconductor element 110N to be evaluated with the discharge inhibitor 102 being bonded to the semiconductor substrate 101. Further, the active areas 121 can be effectively used. The discharge inhibitor 102 can be peeled off from the semiconductor substrate 101 in wire bonding of the semiconductor substrate 101. Thus, the discharge inhibitor 102 does not impair the assembly of products. For example, narrowing of a region where the wire bonding is performed can be prevented. Thus, the discharge inhibitor 102 can inhibit partial discharge, and does not impair the assembly of products. Further, the discharge inhibitor 102 can prevent, for example, external dust from contaminating the semiconductor substrate 101 before the assembly of products is started, and reduce increase in a rejection rate which is caused by the dust.

The latex fluid to be cured is preferably applied at room temperatures. The latex fluid to be cured is preferably cured at a temperature from 30 to 100° C., and more preferably cured at a temperature from 90 to 100° C. This can prevent degradation of a latex, and further inhibit partial discharge. When a latex fluid to be cured is cured at a temperature higher than these ranges, prevention of degradation of the latex tends to be difficult. The more the temperature increases, the faster the latex is degraded. Specifically, when the temperature increases by 10° C., the degradation rate of the latex is approximately doubled.

The latex fluid to be cured has coagulating properties when coming in contact with, for example, air and acetic acid.

A preferable storage temperature of the latex fluid to be cured ranges from 0 to 30° C. Thus, the latex fluid to be cured can be stored at room temperatures.

As described above, the discharge inhibitor 102 is not bonded to the surface 191S of the center 191 of each semiconductor element 110N. Even when the discharge inhibitor 102 is made of a latex having a degradation rate which increases as the temperature rises, the high heat emitted from the surface 191S of the center 191 of each semiconductor element 110N with application of a voltage to each semiconductor element 110N for, for example, evaluation thereof can be prevented from being transferred to the latex. Consequently, the discharge inhibitor 102 can be prevented from degradation.

The latex included in the discharge inhibitor 102 is, for example, a synthetic latex. The synthetic latex preferably has a low glass transition temperature, and more preferably has a glass transition temperature lower than or equal to −20° C. The reason why the synthetic latex preferably has a low glass transition temperature is because the synthetic latex having a low glass transition temperature is soft and can prevent the plurality of semiconductor elements 110 from being damaged when the discharge inhibitor 102 is peeled off from the semiconductor substrate 101. Thus, the synthetic latex is preferably a synthetic latex containing butadiene.

Even when a component for inhibiting partial discharge such as a silicone rubber is not pressed against the semiconductor substrate 101, the discharge inhibitor 102 can secure the creepage distance between each semiconductor element 110N and the inter-element portion 111. Thus, the component for inhibiting partial discharge such as a silicone rubber need not be pressed against the semiconductor substrate 101. This can prevent adhesion of a foreign substance to the semiconductor substrate 101, and prevent formation of the traces of the component in the semiconductor substrate 101.

1.4 Modification Examples of Structure of Semiconductor Substrate

Figure 6:
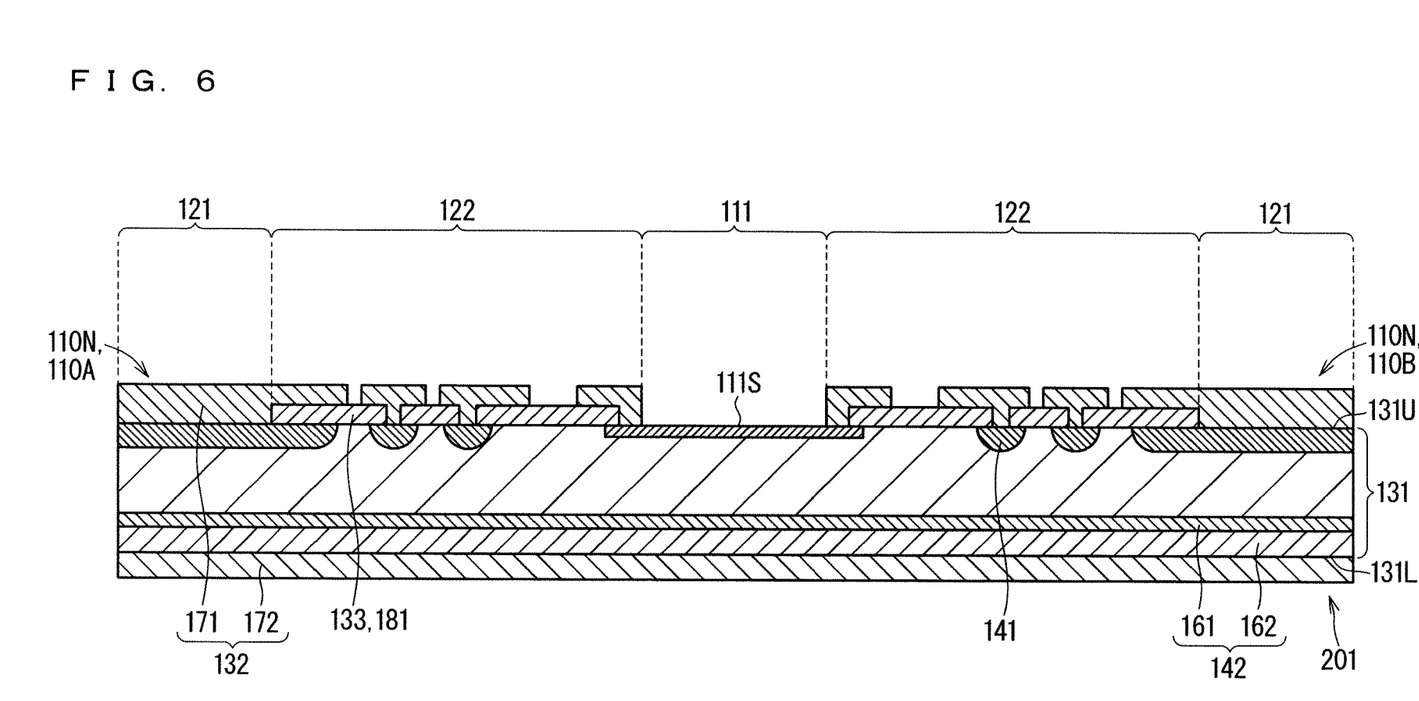
FIG. 6 schematically illustrates a sectional view of a semiconductor substrate included in a semiconductor device according to the first modification of Embodiment 1.
Figure 7:
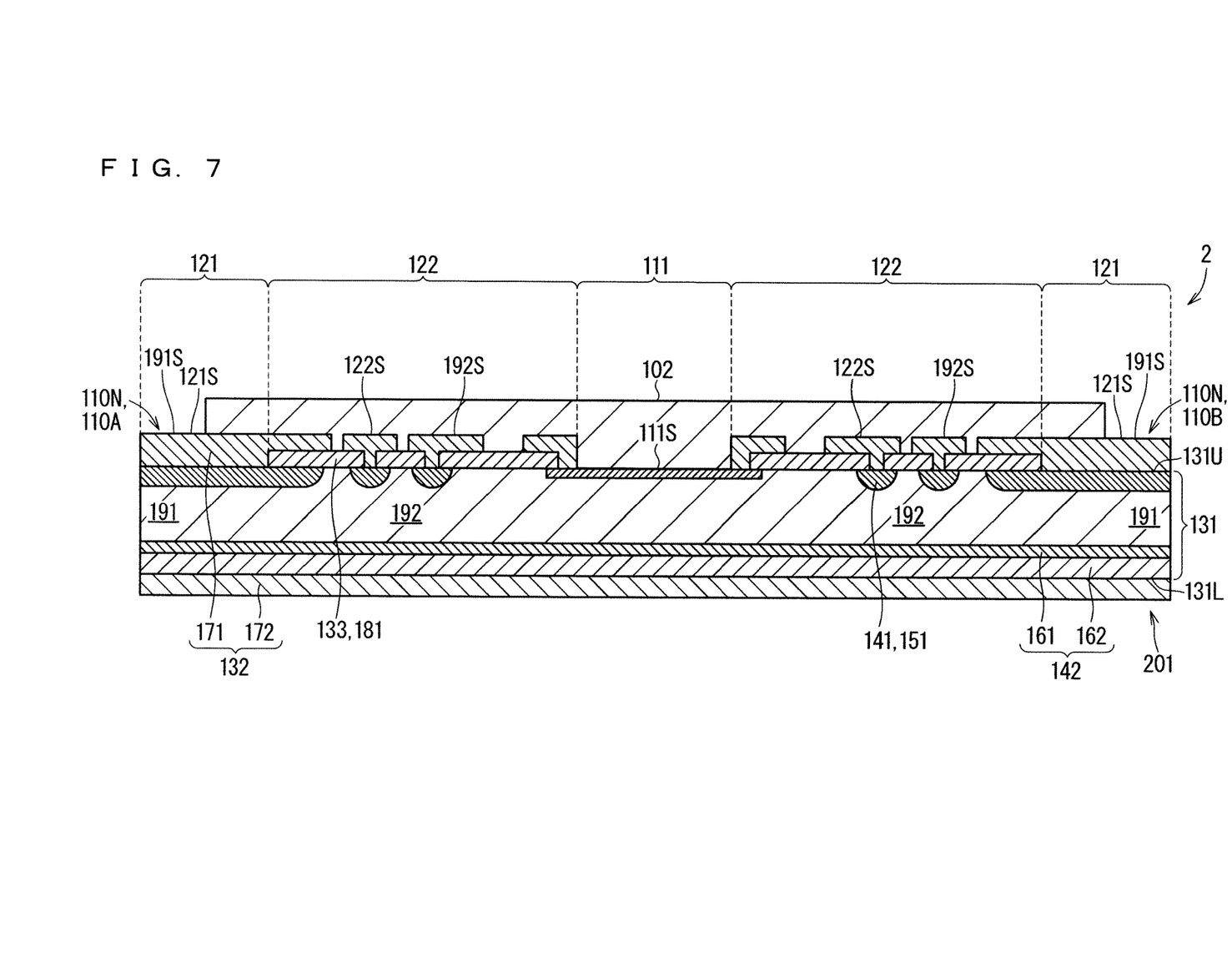
FIG. 7 schematically illustrates a sectional view of the semiconductor device according to the first modification of Embodiment 1.
Figure 8:
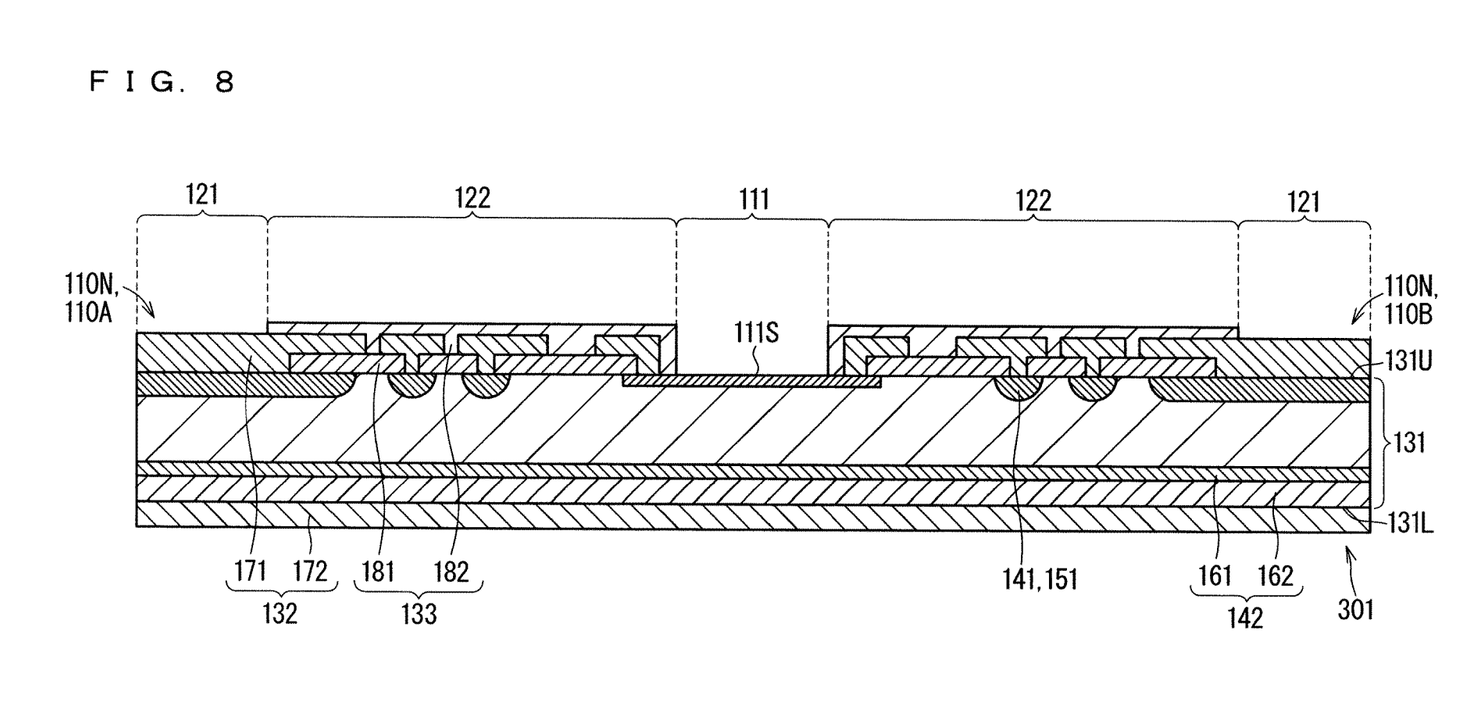
FIG. 8 schematically illustrates a sectional view of a semiconductor substrate included in a semiconductor device according to the second modification of Embodiment 1.
Figure 9:
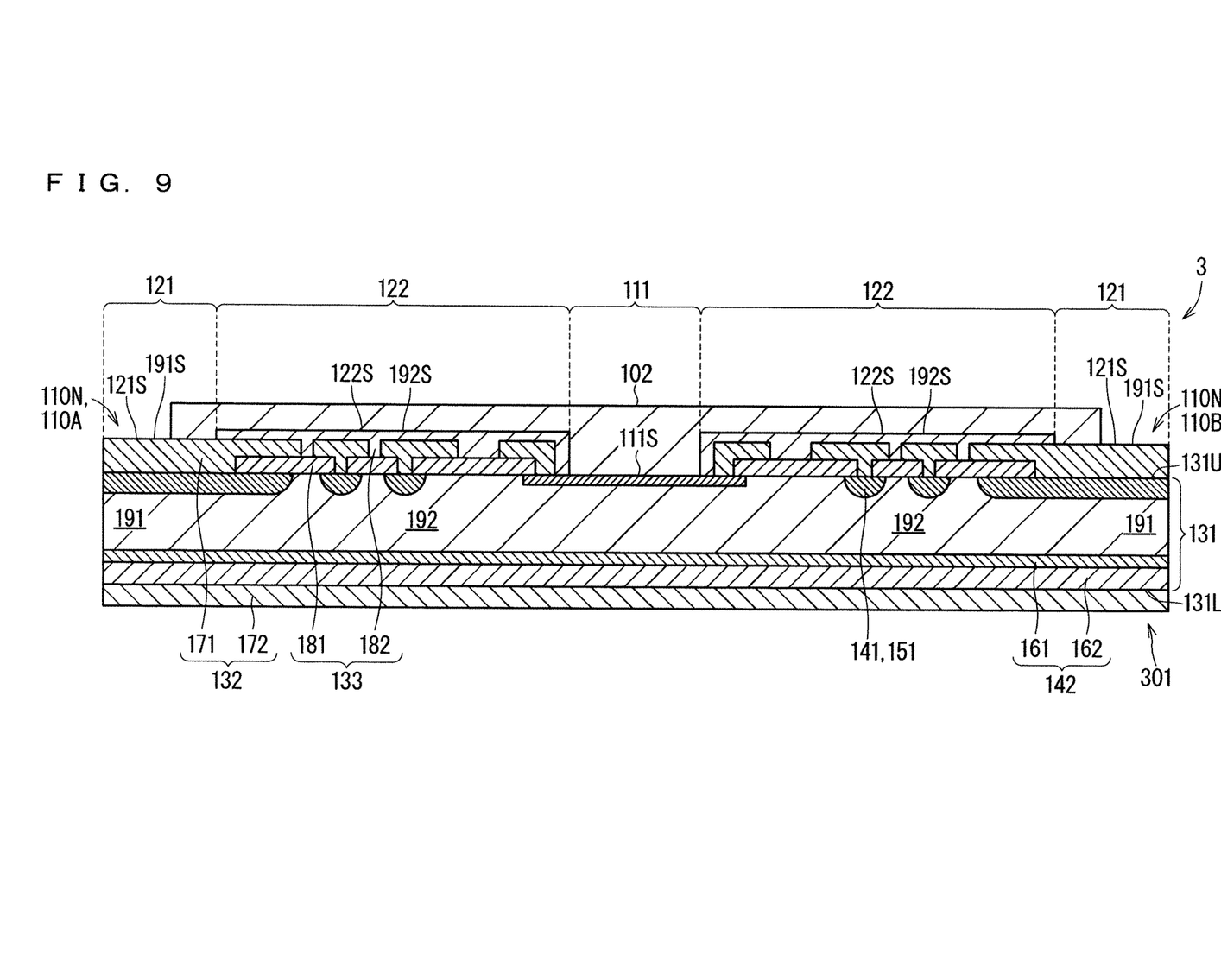
FIG. 9 schematically illustrates a sectional view of the semiconductor device according to the second modification of Embodiment 1.

FIG. 6 schematically illustrates a sectional view of a semiconductor substrate included in a semiconductor device according to the first modification of Embodiment 1. FIG. 7 schematically illustrates a sectional view of the semiconductor device according to the first modification of Embodiment 1. FIG. 8 schematically illustrates a sectional view of a semiconductor substrate included in a semiconductor device according to the second modification of Embodiment 1. FIG. 9 schematically illustrates a sectional view of the semiconductor device according to the second modification of Embodiment 1.

A semiconductor substrate 201 included in a semiconductor device 2 according to the first modification of Embodiment 1 which is illustrated in FIGS. 6 and 7 differs from the semiconductor substrate 101 included in the semiconductor device 1 according to Embodiment 1 which is illustrated in FIGS. 3 and 4, in not including the second insulating layer 182 and the third insulating layer 183.

A semiconductor substrate 301 included in a semiconductor device 3 according to the second modification of Embodiment 1 which is illustrated in FIGS. 8 and 9 differs from the semiconductor substrate 101 included in the semiconductor device 1 according to Embodiment 1 which is illustrated in FIGS. 3 and 4, in not including the third insulating layer 183.

1.5 Width of Discharge Inhibitor

When the semiconductor device 1 does not include the discharge inhibitor 102, application of a voltage to each semiconductor element 110N for, for example, evaluation thereof may cause partial discharge between the top electrode 171 belonging to each semiconductor element 110N and the inter-element portion 111. The occurring partial discharge is a spark discharge phenomenon. Hence, a relationship between a sparking voltage that is a voltage causing partial discharge and the creepage distance between the top electrode 171 belonging to each semiconductor element 110N and the inter-element portion 111 can be calculated from Paschen's law.

Figure 10:
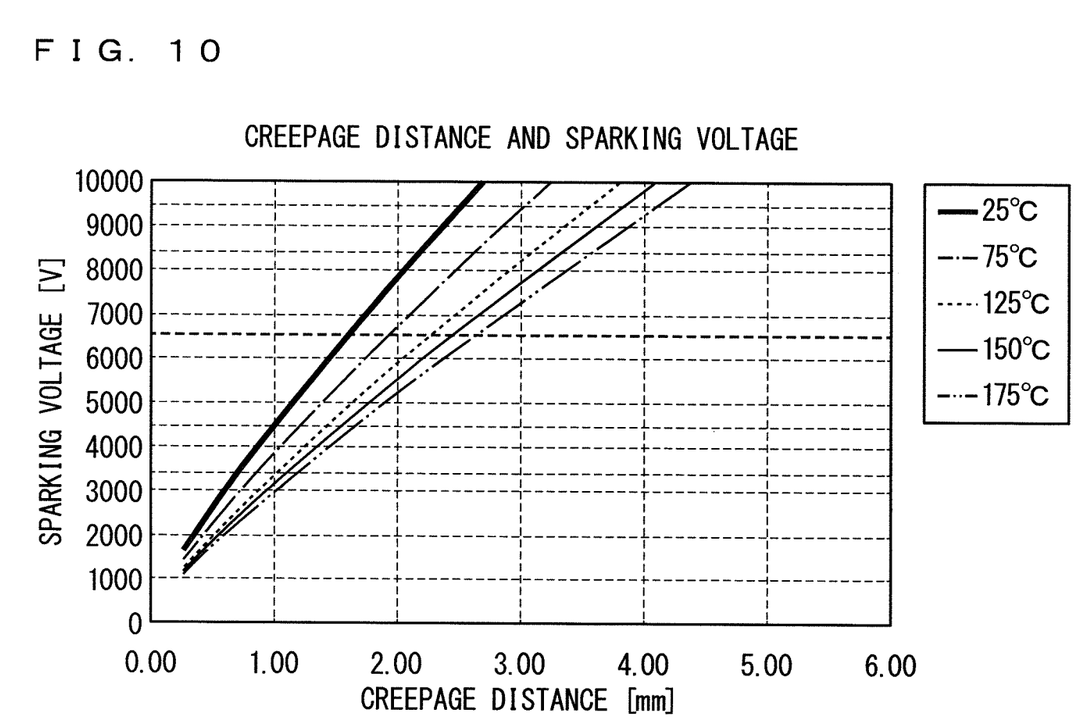
FIG. 10 is a graph illustrating a relationship, which is calculated from Paschen's law, between a sparking voltage that is a voltage causing partial discharge between a top electrode belonging to the respective semiconductor elements and an inter-element portion and a creepage distance between the top electrode belonging to the respective semiconductor elements and the inter-element portion, in the semiconductor substrate included in the semiconductor device according to Embodiment 1.

FIG. 10 is a graph illustrating a relationship, which is calculated from Paschen's law, between a sparking voltage that is a voltage causing partial discharge between the top electrode belonging to each semiconductor element and the inter-element portion and a creepage distance between the top electrode belonging to each semiconductor element and the inter-element portion, in the semiconductor substrate included in the semiconductor device according to Embodiment 1. FIG. 10 illustrates the relationship between the sparking voltage and the creepage distance at each of temperatures of 25° C., 75° C., 125° C., 150° C., and 175° C.

When the width of the discharge inhibitor 102 is determined, a voltage to be applied between the top electrode 171 belonging to each semiconductor element 110N and the inter-element portion 111 for, for example, evaluating each semiconductor element 110N is specified first. Then, the creepage distance which is given by the sparking voltage which is identical with the specified voltage is specified, with reference to the relationship between the sparking voltage and the creepage distance which is calculated from Paschen's law as illustrated in FIG. 10. Further, the width of the discharge inhibitor 102 is determined so that the creepage distance between the top electrode 171 belonging to each semiconductor element 110N and the inter-element portion 111 is longer than the specified creepage distance. This can prevent partial discharge between the top electrode 171 belonging to each semiconductor element 110N and the inter-element portion 111.

Next, theoretical derivation of a relationship between a sparking voltage and a creepage distance which gives the sparking voltage is generated will be described.

A sparking voltage V [V] that is a voltage causing spark discharge between parallel electrodes is expressed by Equation (1) based on Paschen's law.

$$V = A(pd)/(\ln(pd)+B) \tag{1}$$

Here, p denotes a pressure of a surrounding gas [ton]. d denotes a distance between the electrodes [μm]. A and B are constants determined by the surrounding gas.

When the surrounding gas is the atmosphere, the sparking voltage V [V] is experimentally expressed by Equation (2).

$$V = 126 \, (pd)(\log_{10}(pd)/0.22) \tag{2}$$

Further, a relative air density ρ is expressed by Equation (3).

$$\rho = 0.386p/(273+t) \tag{3}$$

Here, t denotes a temperature [° C.].

2 Embodiment 2

Figure 11:
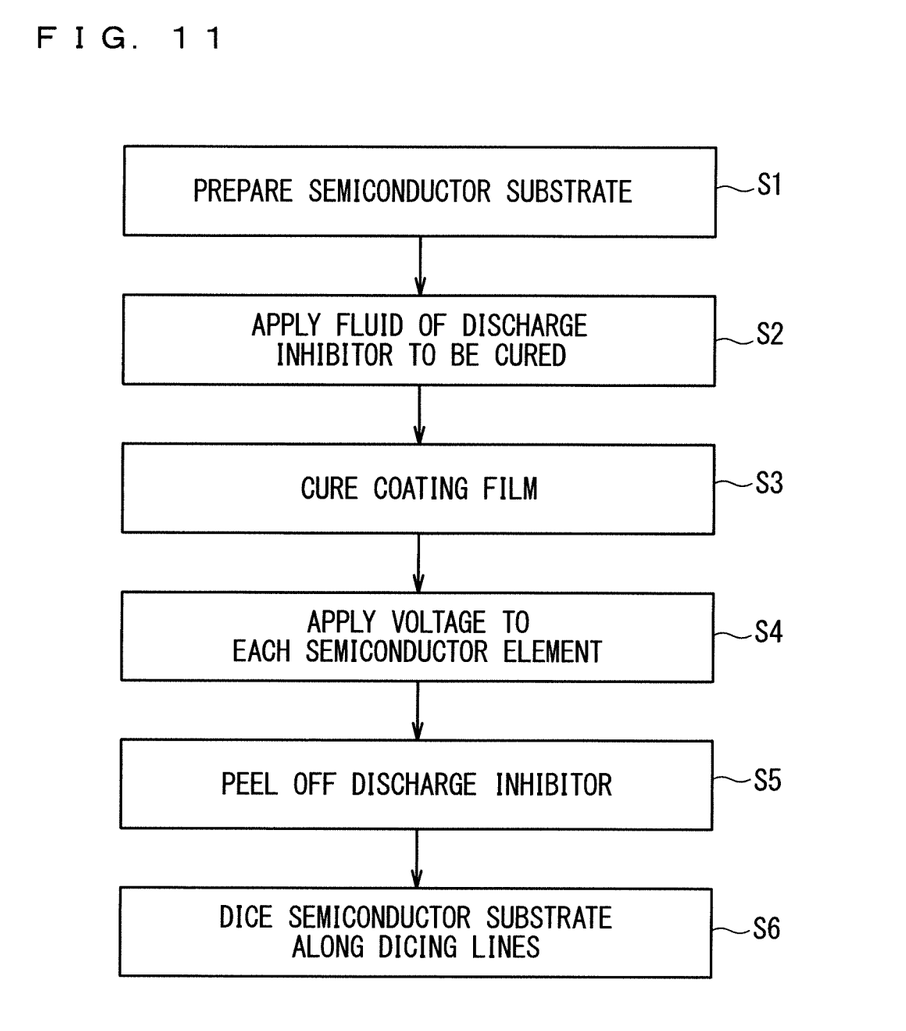
FIG. 11 is a flowchart illustrating a method for manufacturing a semiconductor element according to Embodiment 2.

FIG. 11 is a flowchart illustrating a method for manufacturing a semiconductor element according to Embodiment 2.

The method for manufacturing the semiconductor element according to Embodiment 2 includes Steps 1 to 6 in FIG. 11.

In Step S1, the semiconductor substrate 101 is prepared.

When the semiconductor substrate 101 is prepared, a semiconductor wafer is prepared.

Impurities are implanted into the prepared semiconductor wafer. Then, the prepared semiconductor wafer is heated. This forms the p-type diffusion layer 141 and the n-type diffusion layer 142 in the semiconductor wafer, thus obtaining the semiconductor wafer 131 illustrated in FIG. 3.

Then, the electrodes 132 and the insulating layers 133 are formed on the obtained semiconductor wafer 131. Thereby, the semiconductor substrate 101 illustrated in FIG. 3 is obtained.

The obtained semiconductor substrate 101 includes the plurality of semiconductor elements 110, and the inter-element portions 111 that are dicing lines. The plurality of semiconductor elements 110 are divided by the dicing lines 111. Each semiconductor element 110N includes the active area 121 and the terminal area 122.

In Steps S2 and S3 after Step S1, the discharge inhibitor 102 illustrated in FIG. 4 is bonded to the semiconductor substrate 101.

In Step S2, a coating film is formed by applying a fluid of the discharge inhibitor 102 to be cured to the prepared semiconductor substrate 101. The fluid to be cure is applied along the dicing lines 111. The fluid to be cured is preferably applied by an ink jet device. Thus, a patterning mask is unnecessary. Consequently, the step of forming the discharge inhibitor 102 can be simplified.

In Step S3 after Step S2, the formed coating film is cured to alter the coating film into the discharge inhibitor 102 illustrated in FIG. 4. When the coating film is cured, the coating film is heated.

In Step S4 after Step S3, a voltage is applied to each semiconductor element 110N. The electrical characteristics of each semiconductor element 110N are evaluated using the applied voltage.

In Step S5 after Step S4, the discharge inhibitor 102 is peeled off from the semiconductor substrate 101.

In Step S6 after Step S5, the semiconductor substrate 101 is diced along the dicing lines 111. When the semiconductor substrate 101 is diced, the semiconductor substrate 101 is cut by a rotating blade along the dicing lines 111. Consequently, the plurality of semiconductor elements 110 are separated from one another, so that the chip-like semiconductor elements are obtained.

In Steps S2 and S3, after the fluid of the discharge inhibitor 102 to be cured is applied along the dicing lines 111, it is heated and cured. This can stabilize the shape of the discharge inhibitor 102, and reduce variations in the effect of inhibiting partial discharge in the discharge inhibitor 102.

Before the electrical characteristics of each semiconductor element 110N are evaluated in Step S4, the discharge inhibitor 102 is bonded to the semiconductor substrate 101 in Steps S2 and S3. This can prevent a foreign substance such as dust from being adhered to, for example, the field grading structure formed in the terminal area 122, and the dicing lines 111 during the storage of the semiconductor device 1. Even when a component for inhibiting partial discharge such as a silicone rubber is not pressed against the semiconductor substrate 101, the discharge inhibitor 102 can secure the creepage distance between each semiconductor element 110N and the inter-element portion 111. Thus, the component for inhibiting partial discharge such as a silicone rubber need not be pressed against the semiconductor substrate 101 in Step S4. This can prevent adhesion of a foreign substance to the semiconductor substrate 101, and prevent formation of the traces of the component in the semiconductor substrate 101 in Step S4.

Within the scope of the present invention, Embodiments can be freely combined, and each of Embodiments can be appropriately modified or omitted.

Although this invention has been described in detail, the description is in all aspects illustrative and does not restrict the invention. It is therefore understood that numerous modifications and variations that have not yet been exemplified can be devised without departing from the scope of the invention.

What is claimed is:

1. A semiconductor device, comprising:
a semiconductor substrate including:
a plurality of semiconductor elements arranged in a spreading direction of the semiconductor substrate; and
an inter-element portion between adjacent semiconductor elements among the plurality of semiconductor elements; and
a discharge inhibitor bonded not to a surface of a center of each semiconductor element among the plurality of semiconductor elements but to a surface of the inter-element portion, the discharge inhibitor being made of an insulator, wherein
a thickness of the semiconductor substrate from the surface of the inter-element portion to a bottom surface of the semiconductor substate is uniform across the entire inter-element portion.

2. The semiconductor device according to claim 1, wherein the discharge inhibitor is further bonded to a surface of a perimeter of each semiconductor element.

3. The semiconductor device according to claim 1, wherein
each semiconductor element includes an active area and a terminal area surrounding the active area, and
the discharge inhibitor is bonded to a part of a surface of the active area and a surface of the terminal area.

4. A semiconductor device, comprising:
a semiconductor substrate including:
a plurality of semiconductor elements arranged in a spreading direction of the semiconductor substrate; and
an inter-element portion between adjacent semiconductor elements among the plurality of semiconductor elements; and
a discharge inhibitor bonded not to a surface of a center of each semiconductor element among the plurality of semiconductor elements but to a surface of the inter-element portion, the discharge inhibitor being made of an insulator, wherein
the discharge inhibitor can be peeled off from the semiconductor substrate without damaging the plurality of semiconductor elements.

5. The semiconductor device according to claim 1, wherein the discharge inhibitor is made of a latex.

6. The semiconductor device according to claim 1, wherein the discharge inhibitor is a dry film.

7. The semiconductor device according to claim 1, wherein the discharge inhibitor is a rubber seal.

8. A method for manufacturing a semiconductor element, comprising the steps of:
a) preparing a semiconductor substrate including: a plurality of semiconductor elements arranged in a spreading direction of the semiconductor substrate; and a dicing line between adjacent semiconductor elements among the plurality of semiconductor elements;
b) bonding a discharge inhibitor not to a surface of a center of each semiconductor element among the plurality of semiconductor elements but to a surface of the dicing line so that the discharge inhibitor is bonded to the semiconductor substrate, the discharge inhibitor being made of an insulator;
c) applying a voltage to each semiconductor element after the step b);
d) peeling off the discharge inhibitor from the semiconductor substrate after the step c); and e) dicing the semiconductor substrate along the dicing line after the step d).

9. The method according to claim 8,
wherein the step b) includes:
b-1) applying a fluid of the discharge inhibitor to be cured to the semiconductor substrate to form a coating film; and
b-2) curing the coating film to alter the coating film into the discharge inhibitor.

10. The semiconductor device according to claim 1, wherein
each semiconductor element includes an active area and a terminal area surrounding the active area,
the discharge inhibitor is not bonded to any area of the active area between the center of each semiconductor element and an area adjacent to the terminal area, and
the discharge inhibitor is bonded to an electrode on the substrate in the adjacent area.

\* \* \* \* \*